(12) United States Patent
Lee

(10) Patent No.: US 6,987,694 B2
(45) Date of Patent: Jan. 17, 2006

(54) METHODS OF PROGRAMMING NON-VOLATILE SEMICONDUCTOR MEMORY DEVICES INCLUDING COUPLING VOLTAGES AND RELATED DEVICES

(75) Inventor: Chang-Hyun Lee, Gyeonggi-do (KR)

(73) Assignee: Samsung Electronics Co., Ltd., Kyunggi-Do (KR)

( * ) Notice: Subject to any disclaimer, the term of this patent is extended or adjusted under 35 U.S.C. 154(b) by 158 days.

(21) Appl. No.: 10/640,082

(22) Filed: Aug. 13, 2003

(65) Prior Publication Data

US 2004/0080980 A1 Apr. 29, 2004

(30) Foreign Application Priority Data

Oct. 23, 2002 (KR) ...................... 10-2002-0064767

(51) Int. Cl.
*G11C 16/00* (2006.01)
(52) U.S. Cl. .......................... 365/185.17; 365/185.18; 365/185.23; 365/185.28
(58) Field of Classification Search ........... 365/185.17, 365/185.18, 185.23, 185.28
See application file for complete search history.

(56) References Cited

U.S. PATENT DOCUMENTS

| | | | |
|---|---|---|---|
| 5,677,873 A | 10/1997 | Choi et al. ............. | 365/185.17 |
| 5,715,194 A | 2/1998 | Hu ........................ | 365/185.17 |
| 5,768,188 A | 6/1998 | Park et al. ............. | 365/185.03 |
| 5,959,892 A * | 9/1999 | Lin et al. ............... | 365/185.28 |
| 5,973,962 A * | 10/1999 | Kwon ................... | 365/185.18 |
| 5,991,202 A | 11/1999 | Derhacobian et al. . | 365/185.19 |
| 6,061,270 A | 5/2000 | Choi ..................... | 365/185.02 |

OTHER PUBLICATIONS

Jea-Duk Lee; "Effects of Floating-Gate Interference on NAND Flash Memory Cell Operation", IEEE Electron Device Letters, vol. 23, No. 5 (May 2002).

* cited by examiner

*Primary Examiner*—Tan T. Nguyen
(74) *Attorney, Agent, or Firm*—Myers Bigel Sibley & Sajovec

(57) ABSTRACT

A non-volatile memory device may include a string of serially connected memory cell transistors with each memory cell transistor of the string being connected to a different word line. The non-volatile memory device may be programmed by applying a pass voltage to a first word line connected to a first memory cell transistor of the string, by applying a coupling voltage to a second word line connected to a second memory cell transistor of the string, and by applying a program voltage to a third word line connected to a third memory cell transistor of the string. More particularly, the coupling voltage can be greater than a ground voltage of the memory device, and the pass voltage and the coupling voltage can be different. In addition, the program voltage can be applied to the third word line while applying the pass voltage to the first word line and while applying the coupling voltage to the second word line, and the third memory cell transistor can be programmed responsive to applying the program voltage to the third word line wherein the second memory cell transistor is between the first and third memory cell transistors of the serially connected string. Related devices are also discussed.

82 Claims, 9 Drawing Sheets

METHODS OF PROGRAMMING NON-VOLATILE SEMICONDUCTOR MEMORY DEVICES INCLUDING COUPLING VOLTAGES AND RELATED DEVICES

RELATED APPLICATIONS

This application claims the benefit of priority from Korean Patent Application No. 2002-64767, filed on Oct. 23, 2002, the disclosure of which is herein incorporated by reference in its entirety.

FIELD OF THE INVENTION

The present invention relates to semiconductor memory devices, and, more particularly, to methods of programming non-volatile semiconductor memories and related devices.

BACKGROUND OF THE INVENTION

There has been an increasing demand for electrically erasable and programmable memory devices that do not require refreshing of data stored therein. Current trends of memory devices have been to increase capacity and reliability. A NAND-type flash memory is an example of a non-volatile semiconductor memory device that provides relatively large capacity and relatively high reliability without refreshing stored data. Because data can be maintained without power, flash memory devices have been widely applied to battery powered electronic devices (e.g., handheld terminals and computers, etc.) where power may be interrupted suddenly.

A NAND-type flash memory may include electrically erasable and programmable read-only memory cells called "flash EEPROM cells". Commonly, a flash EEPROM cell may include a memory cell transistor or a floating gate transistor, which may be formed on a pocket P-well region of a substrate and may have spaced apart N-type source and drain regions, a floating gate formed over a channel region between the source and drain regions to store charge, and a control gate placed over the floating gate.

A NAND-type flash memory may include a memory cell array, having a plurality of strings (called cell strings or NAND strings) corresponding to bit lines, respectively. Each cell string may include a string select transistor as a first select transistor, a ground select transistor as a second select transistor, and plural memory cells connected in series between the string and ground select transistors. A string select transistor in each string may have a drain connected to a corresponding bit line and a gate connected to a string select line. A ground select transistor in each string may have a source connected to a common select line and a gate connected to a ground select line. Memory cells in each string may be connected in series between a source of the string select transistor and a drain of the ground select transistor. Memory cells in each string may be connected to corresponding word lines, respectively.

Initially, for example, memory cells can be erased to have a threshold voltage of −3V. A threshold voltage of a selected memory cell may be shifted to a higher voltage range by applying a relatively high voltage (or a program voltage) (e.g., 20V) to a word line of the selected memory cell at a predetermined time. Threshold voltages of remaining or unselected memory cells are not significantly varied.

One problem may arise when programming a portion of memory cells (hereinafter, referred to as "program memory cells") in a selected word line and program-inhibiting remaining memory cells (hereinafter, referred to as "program-inhibit memory cells") in the selected word line. When a program voltage is applied to a selected word line, it may be applied to program memory cells and to program-inhibit memory cells at the same time. Program-inhibit memory cells in the selected word line may be programmed according to a phenomenon referred to as "program disturbance".

One method for reducing the program disturbance is a program inhibition method using a self-boosting scheme. Program inhibition methods using self-boosting schemes are discussed, for example, in U.S. Pat. No. 5,677,873 entitled "METHODS OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN" and in U.S. Pat. No. 5,991,202 entitled "METHOD FOR REDUCING PROGRAM DISTURB DURING SELF-BOOSTING IN A NAND FLASH MEMORY". The disclosures of both of these patents are herein incorporated by reference.

A program inhibition method using such a self-boosting scheme will be described below with reference to FIG. 1. A ground path may be formed by applying a voltage of 0V to a gate of a ground select transistor GST. A voltage of 0V may be applied to a selected bit line (e.g., BL0) and a power supply voltage Vcc(as a program inhibition voltage) may be applied to an unselected bit line (e.g., BL1). Simultaneously, a power supply voltage $V_{cc}$ may be applied to a string select line SSL. A source of a string select transistor SST connected to the unselected bit line BL1 may be charged up to $V_{cc}-V_{th}$ ($V_{th}$ being a threshold voltage of the string select transistor), and then the transistor SST connected to the unselected bit line BL1 ay be shut off. A program voltage $V_{pgm}$ can be applied to a selected word line (e.g., WL14) and a pass voltage $V_{pass}$ can be applied to unselected word lines (e.g., WL0–WL13, WL15), and a channel voltage of a program-inhibit cell transistor can be boosted by the program voltage $V_{pgm}$. The boosted channel voltage may be expressed by the following equation:

$$V_{ch} = \frac{V_{cc} - V_{th}}{N} + V_{pgm}\frac{C_i}{C_t + C_{ch}}.$$

In this equation, N is a word line number, $V_{th}$ is a threshold voltage of a string select transistor, $C_{ch}$ is a channel capacitance of a program-inhibit cell transistor, and $C_t$ is a total capacitance of the program-inhibit cell transistor. The $C_t$ is ($C_{ono}$∥$C_{tun}$) wherein Cono and Ctun are coupling capacitances.

Although a program voltage is applied to a control gate of a program-inhibit cell transistor, a boosted channel voltage may reduce F-N tunneling between a floating gate and a channel of the program-inhibit cell transistor. Accordingly, the program-inhibit cell transistor may maintain an initial erased state.

Another program-inhibit method using a local self-boosting scheme is discussed, for example, in U.S. Pat. No. 5,715,194 entitled "BIAS SCHEME OF PROGRAM INHIBIT FOR RANDOM PROGRAMMING IN A NAND FLASH MEMORY" and in U.S. Pat. No. 6,061,270 entitled "METHOD FOR PROGRAMMING A NON-VOLATILE MEMORY DEVICE WITH PROGRAM DISTURB CONTROL". The disclosures of both of these patents are herein incorporated by reference.

A program inhibition method using such a local self-boosting scheme will be described below with reference to FIG. 2. A voltage of 0V can be applied to a selected bit line (e.g., BL0), and a power supply voltage $V_{cc}$ (as a program inhibition voltage) can be applied to an unselected bit line (e.g., BL1). Since a power supply voltage is applied to a string select line SSL, a source of a string select transistor SST connected to the unselected bit line BL1 may be charged up to $V_{cc}-V_{th}$ (where $V_{th}$ is a threshold voltage of the string select transistor). The transistor SST connected to the unselected bit line BL1 can than be shut off.

A decoupling voltage $V_{dcp}$ of 0V can be applied to unselected word lines (e.g., WL13 and WL15) closely adjacent to a selected word line (e.g., WL14). A pass voltage $V_{pass}$ (e.g., 10V) can be applied to remaining word lines (e.g., WL0–WL12). The selected word line can then be supplied with a program voltage $V_{pgm}$. With this bias condition, since a channel of a program-inhibit cell transistor may be limited by cell transistors of unselected word lines supplied with a decoupling voltage, a boosted channel voltage of the program-inhibit cell transistor can be higher than that caused by the above self-boosting scheme. Similar to the self-boosting method, the boosted channel voltage may reduce F-N tunneling between a floating gate and a channel of a program-inhibit cell transistor so that the program-inhibit cell transistor can maintain an initial erase state.

Methods using the local self-boosting scheme may obtain a higher channel voltage than the self-boosting scheme and may thus be used to program a multi-level cell that stores n-bits of data (where n is an integer greater than or equal to 2). However, the local self-boosting scheme may have a lower program speed as compared with the self-boosting scheme.

In general, a voltage of a floating gate of a memory cell transistor to be programmed may be affected by voltages of floating gates of adjacent cell transistors through capacitive coupling. Such a phenomenon is discussed, for example, in the IEEE ELECTRON DEVICE LETTERS, VOL.23, NO.5, pp. 264 to 266, May 2002 under the title of "EFFECTS OF FLOATING-GATE INTERFERENCE ON NAND FLASH MEMORY CELL OPERATION." The disclosure of this reference is incorporated herein by reference. At any memory cell transistor (hereinafter called "reference memory cell transistor"), as shown in FIG. 3, coupling capacitances $C_{ono}$, $C_{fg}$ and $C_{tun}$ may exist between a floating gate and a channel (bulk or body) of the reference memory cell transistor and between the floating gate of the reference memory cell transistor and floating gates of adjacent memory cell transistors, respectively. A voltage of a floating gate of the reference memory cell transistor may be affected by the coupling capacitances.

A coupling ratio to a control gate of the reference memory cell transistor may be expressed as follows:

$$\gamma_{ono} = \frac{C_{ono}}{C_{tun} + C_{ono} + 2C_{fg}}.$$

In this equation, $C_{ono}$ is a control gate-to-floating gate capacitance, $C_{tun}$ is a floating gate-to-channel capacitance, and $C_{fg}$ is a floating gate-to-floating gate capacitance.

A voltage V1 of a floating gate of a memory cell transistor connected to a first unselected word line may be expressed as follows:

$$V1 = \gamma_{ono}V_{cg1} = \frac{C_{ono}V_{cg1}}{C_{tun} + C_{ono} + 2C_{fg}}.$$

In this equation, $V_{cg1}$ is a voltage applied to a control gate, that is, a voltage applied to an unselected word line.

A voltage V2 of a floating gate of a memory cell transistor connected to a second unselected word line may be expressed as follows:

$$V2 = \gamma_{ono}V_{cg2} = \frac{C_{ono}V_{cg2}}{C_{tun} + C_{ono} + 2C_{fg}}.$$

In this equation, $V_{cg2}$ is a voltage applied to a control gate, that is, a voltage applied to an unselected word line.

Accordingly a voltage $V_{fg}$ of a floating gate of a reference memory cell transistor may be determined as follows:

$$V_{fg} = \gamma_{ONO}V_{cg} + \gamma_{ONO}\gamma_{fg}V_{cg1} + \gamma_{ONO}\gamma_{fg}V_{cg2}.$$

With the local self-boosting method, a program voltage $V_{pgm}$ may be applied to a selected word line (e.g., WL14), while a decoupling voltage $V_{dcp}$ may be applied to two unselected word lines WL13 and WL15 closely adjacent to the selected word line WL14. Based on this bias condition, a voltage of a floating gate of the reference memory cell transistor may be expressed as follows:

$$V_{fg} = \gamma_{ONO}V_{pgm}(WL14) + \gamma_{ONO}\gamma_{fg}V_{dcp}(WL13) + \gamma_{ONO}\gamma_{ONO}\gamma_{fg}V_{dcp}(WL15).$$

Since word lines WL13 and WL15 adjacent to a selected word line WL14 are supplied with 0V, values of $\gamma_{ONO}\gamma_{fg}V_{dcp}$(WL13) and $\gamma_{ONO}\gamma_{fg}V_{dcp}$(WL15) become 0V. Therefore, the floating gate voltage $V_{fg}$ of the reference memory cell transistor may become a voltage of $\gamma_{ONO}\gamma_{fg}V_{dcp}$(WL13).

In accordance with the above description, since a floating gate voltage $V_{fg}$ of a reference memory cell transistor may be unaffected by voltages V1 and V2 of floating gates placed at both sides of the floating gate of a reference memory cell transistor, a program speed of a local self-boosting method may be slower than that of a self-boosting method. That is, in the case of the self-boosting method where a pass voltage is applied to unselected word lines, a floating gate voltage of a reference voltage may be increased by capacitive coupling, so that a program speed is increased as compared with the local self-boosting method.

In case of a NAND flash memory which performs a program operation using an "incremental step pulse programming (ISPP) scheme", a program voltage $V_{pgm}$, for example, can be stepwise increased from 14.7V to 20V as a program cycle is repeated. If a program speed is reduced, a number of program cycles may increase. When using an ISSP scheme, an increase in the program cycle number may require a higher program voltage. This may increase a peripheral circuit (in particular, a high voltage pump) area and a program time. Increases in the peripheral circuit area may result in an increase in a number of high voltage pumping stages used to generate higher voltages.

SUMMARY OF THE INVENTION

According to embodiments of the present invention, methods may be provided for programming a non-volatile memory device including a string of serially connected memory cell transistors with each memory cell transistor of the string being connected to a different word line. In particular, a pass voltage may be applied to a first word line connected to a first memory cell transistor of the string, and a coupling voltage may be applied to a second word line connected to a second memory cell transistor of the string wherein the coupling voltage is greater than a ground voltage of the memory device and wherein the pass voltage and the coupling voltage are different. In addition, a program voltage may be applied to a third word line connected to a third memory cell transistor of the string while applying the pass voltage to the first word line and while applying the coupling voltage to the second word line, with the third memory cell transistor being programmed responsive to applying the program voltage to the third word line. More particularly, the second memory cell transistor may be between the first and third memory cell transistors of the serially connected string.

The pass voltage may also be applied to a fourth word line connected to a fourth memory cell transistor of the string wherein the first memory cell transistor is serially connected between the fourth memory cell transistor and the second memory cell transistor, and the coupling voltage can be greater than the pass voltage. In one alternative, each memory cell transistor of the string can store one bit of data, and in another alternative, each memory cell of the transistor of the string can store a plurality of bits of data.

In addition, a decoupling voltage can be applied to a fourth word line connected to a fourth memory cell transistor of the string wherein the fourth memory cell transistor of the string is serially connected between the first and second memory cell transistors. More particularly, the decoupling voltage can be less than the pass voltage, less than the coupling voltage, and less than the program voltage, and the program voltage can be applied to the third word line while applying the pass voltage to the first word line, while applying the coupling voltage to the second word line, and while applying the decoupling voltage to the fourth word line. The decoupling voltage may be a ground voltage of the memory device, or the decoupling voltage can be less than a ground voltage of the memory device. Before applying the decoupling voltage to the fourth word line, a preliminary voltage can be applied to the fourth word line wherein the preliminary voltage is greater than the decoupling voltage and wherein the decoupling voltage is applied to the fourth word line before applying the program voltage to the third word line. Moreover, the preliminary voltage can be equal to the pass voltage.

The non-volatile memory device may also include a second string of serially connected memory cell transistors with a memory cell transistor of the second string being connected to the third word line. With the second string of memory cell transistors, a channel of the third memory cell transistor may be precharged with a first precharge voltage before applying the program voltage, and a channel of the memory cell transistor of the second string connected to the third word line may be precharged with a second voltage different than the first voltage before applying the program voltage. Moreover, the first voltage may be a ground voltage of the memory device, and the second voltage may be a difference between a power supply voltage of the memory device and a threshold voltage of the select transistor of the second string.

According to additional embodiments of the present invention, methods may be provided for programming a non-volatile memory device including a string of serially connected memory cell transistors with each memory cell transistor of the string being connected to a different word line. In particular, a decoupling voltage may be applied to a first word line connected to a first memory cell transistor of the string, and a coupling voltage may be applied to a second word line connected to a second memory cell transistor of the string wherein the coupling voltage is greater than the decoupling voltage. In addition, a program voltage can be applied to a third word line connected to a third memory cell transistor of the string while applying the decoupling voltage to the first word line and while applying the coupling voltage to the second word line. More particularly, the third memory cell transistor may be programmed responsive to applying the program voltage to the third word line, and the second memory cell transistor may be between the first and third memory cell transistors of the serially connected string.

Before applying the decoupling voltage to the first word line, a preliminary voltage may be applied to the first word line wherein the preliminary voltage is greater that the decoupling voltage and wherein the decoupling voltage is applied to the first word line before applying the program voltage to the third word line. In addition, a pass voltage may be applied to a fourth word line connected to a fourth memory cell transistor of the string wherein the first memory cell transistor is serially connected between the fourth and second memory cell transistors, and the pass voltage may be greater than the decoupling voltage, and/or the pass voltage may be equal to the preliminary voltage.

A pass voltage may also be applied to a fourth word line connected to a fourth memory cell transistor of the string wherein the first memory cell transistor is serially connected between the fourth and second memory cell transistors, and the pass voltage may be greater than the decoupling voltage. In addition, the pass voltage may be applied to a fifth word line connected to a fifth memory cell transistor of the string wherein the fourth memory cell transistor is serially connected between the fifth and first memory cell transistors. More particularly, the coupling voltage may be greater than or equal to the pass voltage, or the coupling voltage may be greater than the pass voltage.

Each memory cell of the string may store one bit of date, or each memory cell of the string may store a plurality of bits of data. Moreover, the decoupling voltage may be a ground voltage of the memory device, or the decoupling voltage may be less than a ground voltage of the memory device. The non-volatile memory device may also include a second string of serially connected memory cell transistors with a memory cell transistor of the second string being connected to the third word line. With the second string of memory cell transistors, a channel of the third memory cell transistor may be precharged with a first precharge voltage before applying the program voltage, and a channel of the memory cell transistor of the second string connected to the third word line may be precharged with a second voltage different than the first voltage before applying the program voltage. More particularly, the first voltage may be a ground voltage of the memory device, and the second voltage may be a difference between a power supply voltage of the memory device and a threshold voltage of the select transistor of the second string.

According to still additional embodiments of the present invention, a non-volatile memory device may include a string of serially connected memory cell transistors, a plurality of word lines with each word line being connected to a different one of the serially connected memory cell transistors, and a row selection circuit connected to the plurality of word lines. The row selection circuit may be configured to apply a pass voltage to a first word line connected to a first memory cell transistor of the string and to apply a coupling voltage to a second word line connected to a second memory cell transistor of the string wherein the coupling voltage is greater than a ground voltage of the memory device and wherein the pass voltage and the coupling voltage are different. The row selection circuit may also be configured to apply a program voltage to a third word line connected to a third memory cell transistor of the string while applying the pass voltage to the first word line and while applying the coupling voltage to the second word line with the third memory cell transistor being programmed responsive to applying the program voltage to the third word line. In addition, the second memory cell transistor may be between the first and third memory cell transistors of the serially connected string.

According to yet additional embodiments of the present invention, a non-volatile memory device may include a string of serially connected memory cell transistors, a plurality of word lines with each word line being connected to a different one of the serially connected memory cell transistors, and a row selection circuit connected to the plurality of word lines. The row selection circuit may be configured to apply a decoupling voltage to a first word line connected to a first memory cell transistor of the string, and to apply a coupling voltage to a second word line connected to a second memory cell transistor of the string wherein the coupling voltage is greater than the decoupling voltage. The row selection circuit may also be configured to apply a program voltage to a third word line connected to a third memory cell transistor of the string while applying the decoupling voltage to the first word line and while applying the coupling voltage to the second word line with the third memory cell transistor being programmed responsive to applying the program voltage to the third word line. In addition, the second memory cell transistor may be between the first and third memory cell transistors of the serially connected string.

DETAILED DESCRIPTION

The present invention will be described more fully hereinafter with reference to the accompanying drawings, in which typical embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. It will also be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

Figure 4:
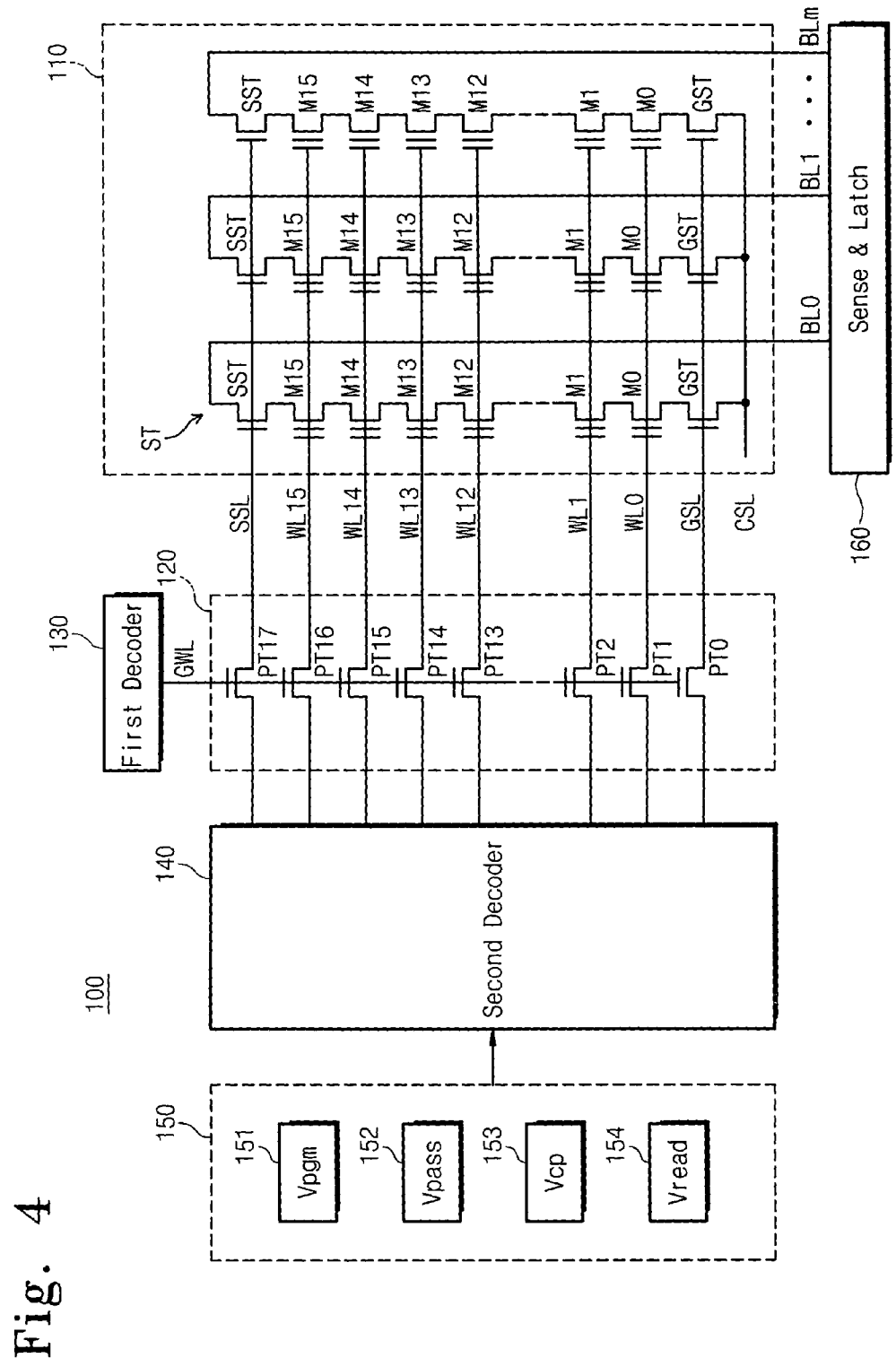
FIG. 4 is a block diagram illustrating non-volatile semiconductor memory devices according to embodiments of the present invention.

Referring to FIG. 4, a NAND-type flash memory according to embodiments of the present invention may include a memory cell array 110 including a plurality of cell strings ST connected to a plurality of bit lines BL0–BLm, respectively. Each string ST includes a string select transistor SST as a first select transistor, a ground select transistor GST as a second select transistor, and a plurality of, for example, 16 memory cells MC0–MC15 connected in series between the string and ground select transistors SST and GST. A string select transistor SST in each string may have a drain connected to a corresponding bit line and a gate connected to a string select line. A ground select transistor GST in each string may have a source connected to a common select line and a gate connected to a ground select line. Memory cells MC0–MC15 in each string may be connected in series between a source of the string select transistor SST and a drain of the ground select transistor GST. Memory cells MC0–MC15 in each string may be connected to corresponding word lines WL0–WL15, respectively.

In memories according to embodiments of the present invention, memory cells may be single-bit cells for storing 1-bit of data. Alternatively, memory cells may be multi-bit cells for storing n-bits of data.

The bit lines BL0–BLm may be connected to a sense and latch circuit (also referred to as a page buffer circuit) 160. The sense and latch circuit 160 charges bit lines according to data bits to be programmed during a program operation. At the program operation, the sense and latch circuit 160 latches data bits supplied from the outside and supplies 0V or a power supply voltage $V_{cc}$ to bit lines based on the latched data bits. For example, the sense and latch circuit 160 may supply the power supply voltage $V_{cc}$ to a bit line of a program-inhibit memory cell transistor, so that a channel of the program-inhibit memory cell transistor may be charged up to $V_{cc}-V_{th}$ ($V_{th}$ being a threshold voltage of a string select transistor). The sense and latch circuit 160 supplies 0V to a bit line of a program memory cell transistor, so that a channel of the program memory cell transistor may be charged to 0V. Supplying of voltages to bit lines can be performed before word line voltages (i.e. program and pass voltages) are applied to corresponding word lines, respectively.

The memory device 100 may further comprise a switch circuit 120 including a plurality of pass transistors PT17–PT0 connected to a string select line SSL, word lines WL15–WL0, and a ground select line GSL, respectively. The pass transistors PT0–PT17 can be turned on or off using a common control signal GWL from a first decoder circuit 130. The control signal GWL may have a voltage sufficient to transfer a word line voltage such as a program voltage $V_{pgm}$, a pass voltage $V_{pass}$, a read voltage $V_{read}$ and/or a coupling voltage $V_{cp}$ through the respective pass transistors. The string select line SSL, the word lines WL15–WL0 and the ground select line GSL can be connected to a second decoder circuit 140 through the switch circuit 120. The second decoder circuit 140 may select one of the word lines WL0–WL15 in response to row address information, and may be provided with word lines voltages (e.g., $V_{pgm}$, $V_{pass}$, $V_{cp}$ and $V_{read}$) from a voltage generator circuit 150. The voltage generator circuit 150 may include a program voltage generator 151 for generating the program voltage $V_{pgm}$, a pass voltage generator 152 for generating the pass voltage $V_{pass}$, a coupling voltage generator 153 for generating the coupling voltage $V_{cp}$, and a read voltage generator 154 for generating the read voltage $V_{read}$. The voltage generators 151–154 can be realized using one or more high voltage pumps.

The switch circuit 120, the first decoder 130, and the second decoder circuit 140 may provide a row selection circuit. Before a program voltage $V_{pgm}$ is applied to a selected word line (or a first word line) during a program operation, the row selector circuit may apply a coupling voltage $V_{cp}$ to at least one unselected word line (or a second word line) closely adjacent to the first word line, a decoupling voltage $V_{dcp}$ to a word line (or a third word line) closely adjacent to the second word line, and a pass voltage $V_{pass}$ to remaining word lines. The decoupling voltage $V_{dcp}$ can be lower than the coupling and pass voltages $V_{cp}$ and $V_{pass}$, and the coupling voltage $V_{cp}$ can be lower or higher than the decoupling voltage $V_{dcp}$. Alternatively, the coupling voltage $V_{cp}$ can be the same as the pass voltage $V_{pass}$.

When a word line WL15 is selected, for example, a word line WL14 can be provided with the coupling voltage $V_{cp}$, a word line WL13 can be provided with the decoupling voltage $V_{dcp}$, and remaining word lines WL0–WL12 can be provided with the pass voltage $V_{pass}$. Likewise, when a word line WL0 is selected, a word line WL1 can be provided with the coupling voltage $V_{cp}$, a word line WL2 can be provided with the decoupling voltage $V_{dcp}$, and remaining word lines WL3–WL15 can be provided with the pass voltage $V_{pass}$.

Alternatively, when a word line WL14 is selected, word lines WL13 and WL15 can be provided with the coupling voltage $V_{cp}$, a word line WL12 can be provided with the decoupling voltage $V_{dcp}$, and remaining word lines WL0–WL11 can be provided with the pass voltage $V_{pass}$. Likewise, when a word line WL1 is selected, word lines WL0 and WL2 can be provided with the coupling voltage $V_{cp}$, a word line WL3 can be provided with the decoupling voltage $V_{dcp}$, and remaining word lines WL4–WL15 can be provided with the pass voltage $V_{pass}$. When one (e.g., WL13) of word lines WL3–WL13 is selected, the coupling voltage $V_{cp}$ can be applied to word lines WL12 and WL14 closely adjacent to the selected word line WL13, the decoupling voltage $V_{dcp}$ can be applied to word lines WL11 and WL15 each adjacent to the word lines WL12 and WL14, and the pass voltage $V_{pass}$ can be applied to remaining word lines WL0–WL10.

Before a program voltage $V_{pgm}$ is applied to a selected word line, a floating gate voltage of a program cell transistor of the selected word line may become higher than 0V, based on a floating gate voltage(s) of an adjacent cell transistor(s) supplied with a coupling voltage $V_{cp}$. When the program voltage $V_{pgm}$ is applied to the selected word line, an electric field across a tunnel oxide of a program cell transistor connected to the selected word line may thus be relatively increased as compared with a local self-boosting method.

Figure 5:
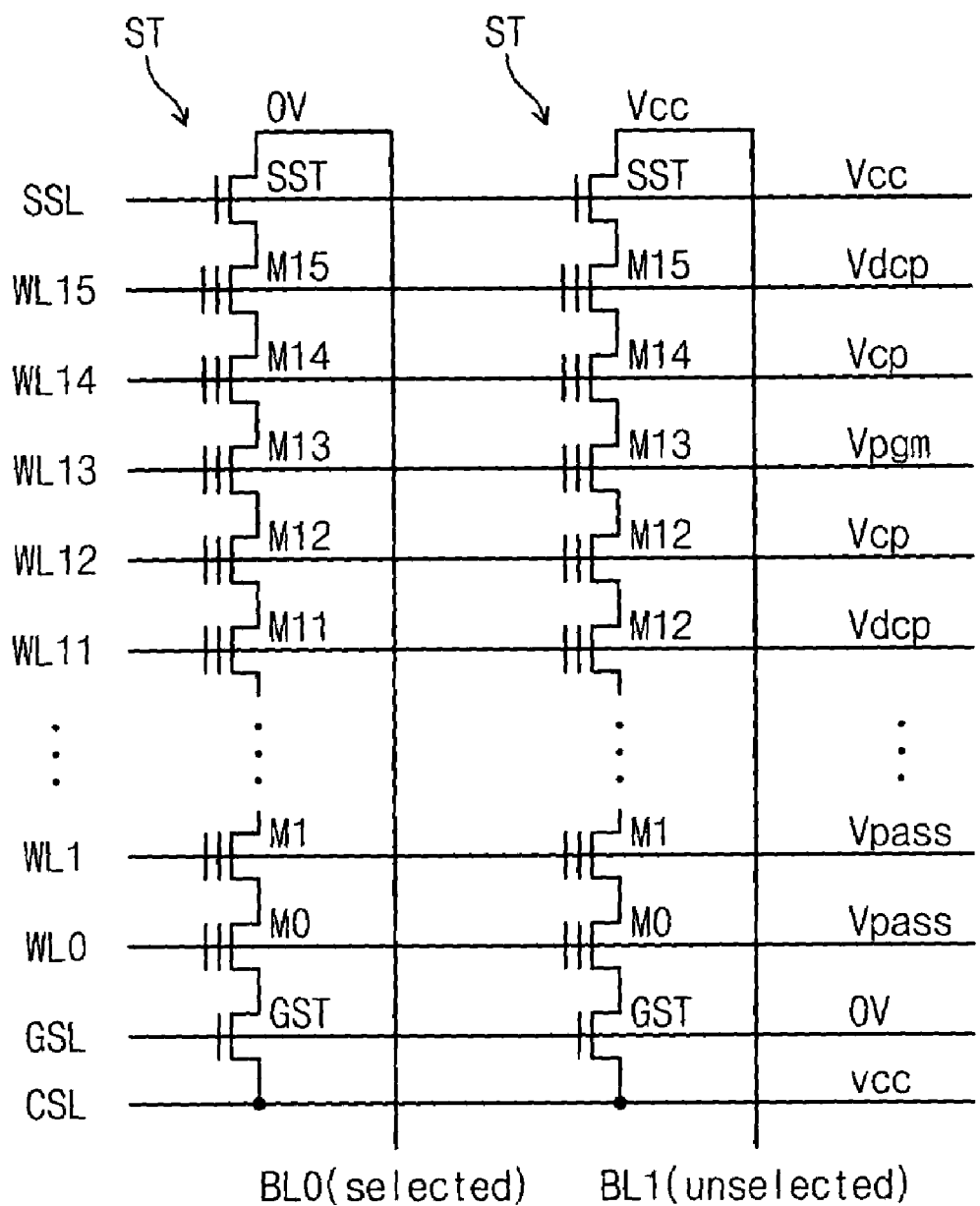
FIG. 5 illustrates word line voltage conditions of program operations according to embodiments of the present invention.
Figure 6:
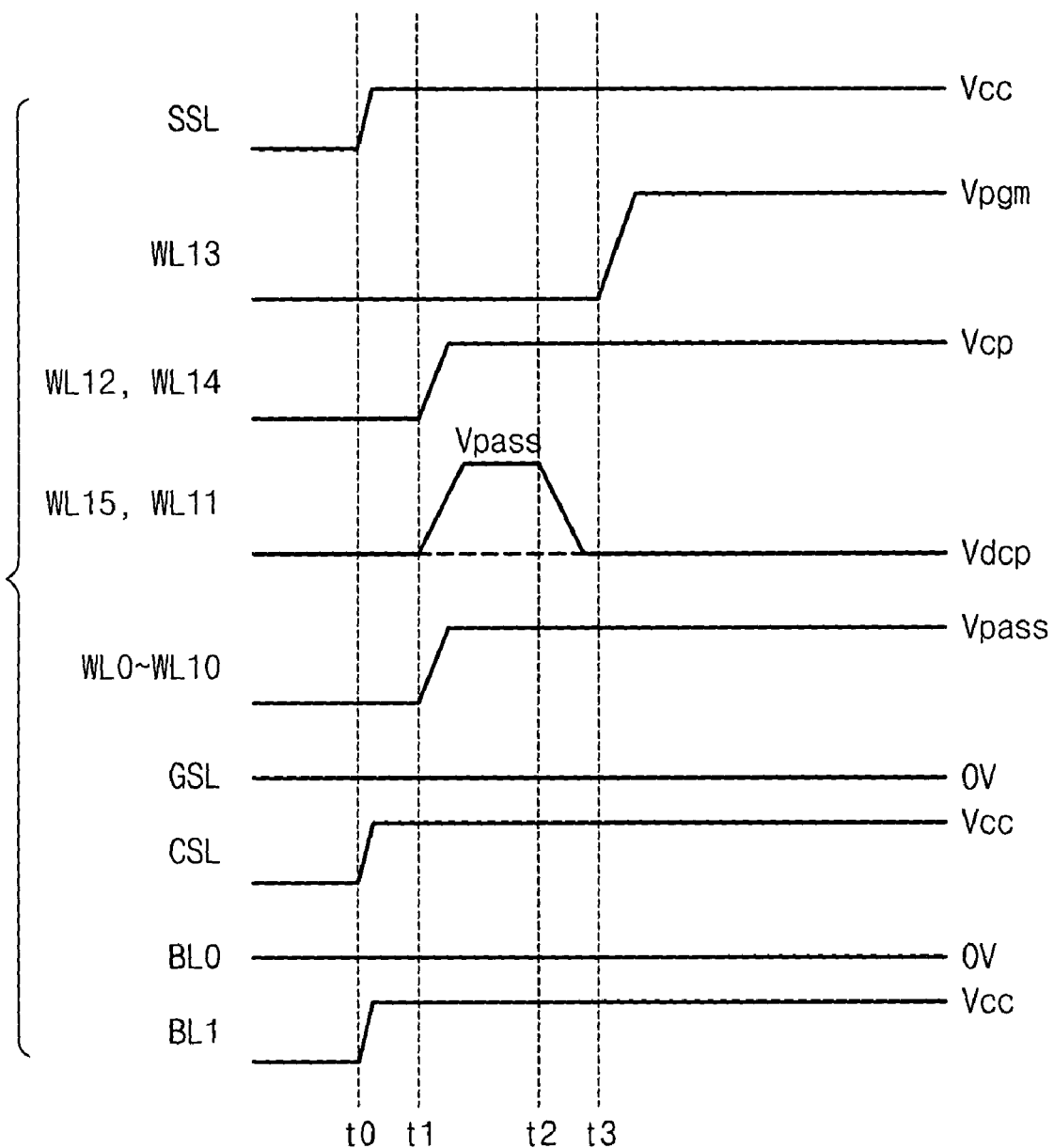
FIG. 6 is a timing diagram illustrating program methods according to embodiments of the present invention.

FIG. 5 is a diagram illustrating a word line voltage condition according to a local self-boosting scheme according to embodiments of the present invention. FIG. 6 is a timing diagram illustrating a program method for a local self-boosting scheme according to embodiments of the present invention. A program operation of a NAND-type flash memory according to embodiments of the present invention will be described below with reference to FIGS. 5 and 6. Hereinafter, a bit line connected to a memory cell to be programmed is referred to as a selected bit line, and a bit line connected to a memory cell to be program-inhibited is referred to as an unselected bit line. Likewise, a word line connected to a memory cell to be programmed is referred to as a selected word line, and remaining word lines are referred to as unselected word lines. In this specification, a term "the most adjacent word line" or "an adjacent word line" means that there are no word lines between two referenced word lines.

At time t1, a ground voltage of 0V is applied to a selected bit line (e.g., BL0) and a power supply voltage $V_{cc}$ is applied to an unselected bit line (e.g., BL1). The power supply voltage $V_{cc}$ is applied to a string select line SSL and the ground voltage is applied to a ground select line GSL. The power supply voltage or the ground voltage is applied to a common source line CSL. Then, between time t1 and time t2, a coupling voltage $V_{cp}$ is applied to unselected word lines (e.g., WL12 and WL14) closely adjacent to a selected word line (e.g., WL13), and a pass voltage $V_{pass}$ is applied to remaining word lines (e.g., WL0–WL11, WL15). Alternatively, as shown in FIG. 6 by a dotted line, 0V instead of the pass voltage $V_{pass}$, can be applied to word lines WL11 and WL15 each adjacent to the word lines WL12 and WL14 opposite the selected word line WL 13.

Since the power supply voltage $V_{cc}$ is applied to the string select line SSL, a source of a string select transistor SST connected to the unselected bit line BL1 can be charged up to $V_{cc}-V_{th}$ ($V_{th}$ being a threshold voltage of the string select transistor). A channel of a cell transistor to be program-inhibited can thus be charged up to $V_{cc}-V_{th}$, and a string select transistor SST connected to the unselected bit line BL1 may be shut off. At time t2, voltages applied to unselected word lines WL11 and WL15 may be changed from $V_{pass}$ to $V_{dcp}$. At time t3, a program voltage $V_{pgm}$ is applied to the selected word line WL 13.

At time t3, the coupling voltage $V_{cp}$ is thus applied to unselected word lines WL12 and WL14 closely adjacent to the selected word line WL13, and the decoupling voltage $V_{dcp}$ is applied to unselected word lines WL11 and WL15 each adjacent to the word lines WL12 and WL14 opposite the selected wordline WL13. Remaining word lines WL0–WL15 can be provided with the pass voltage $V_{pass}$ (e.g., 10V). With this bias condition, before a program voltage $V_{pgm}$ is applied to the selected word line WL13, a predetermined voltage can be induced to a floating gate of a memory cell transistor to be programmed. The floating gate voltage may be expressed as follows:

$$V_{fg} = \gamma_{ONO} V_{pgm}(WL13) + \gamma_{ONO} \gamma_{fg} V_{cp}(WL12) + \gamma_{ONO} \gamma_{fg} V_{cp}(WL14).$$

In this equation $V_{cp}(WL12)$ and $V_{cp}(WL14)$ may be higher than 0V and lower than a pass voltage $V_{pass}$.

It should be understood from the above equation that a voltage may be induced on a floating gate of a memory cell transistor to be programmed before the program voltage $V_{pgm}$ is applied to the selected word line WL13. The voltage induced on the floating gate may be expressed as follows:

$$V_{fg} = \gamma_{ONO}\gamma_{fg}V_{cp}(WL12) + \gamma_{ONO}\gamma_{fg}V_{cp}(WL14).$$

Figure 2:
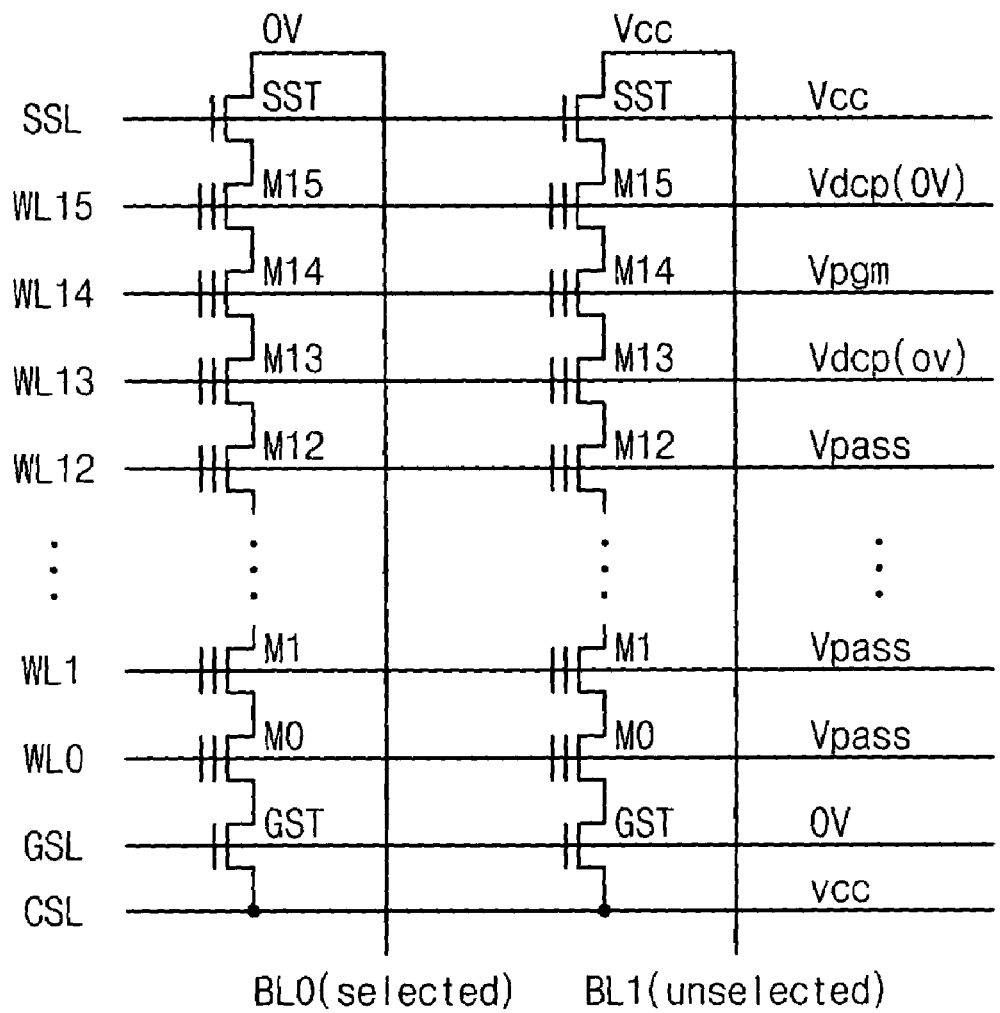
FIG. 2 is a diagram illustrating a program method using a local self-boosting scheme according to the prior art.
Figure 3:
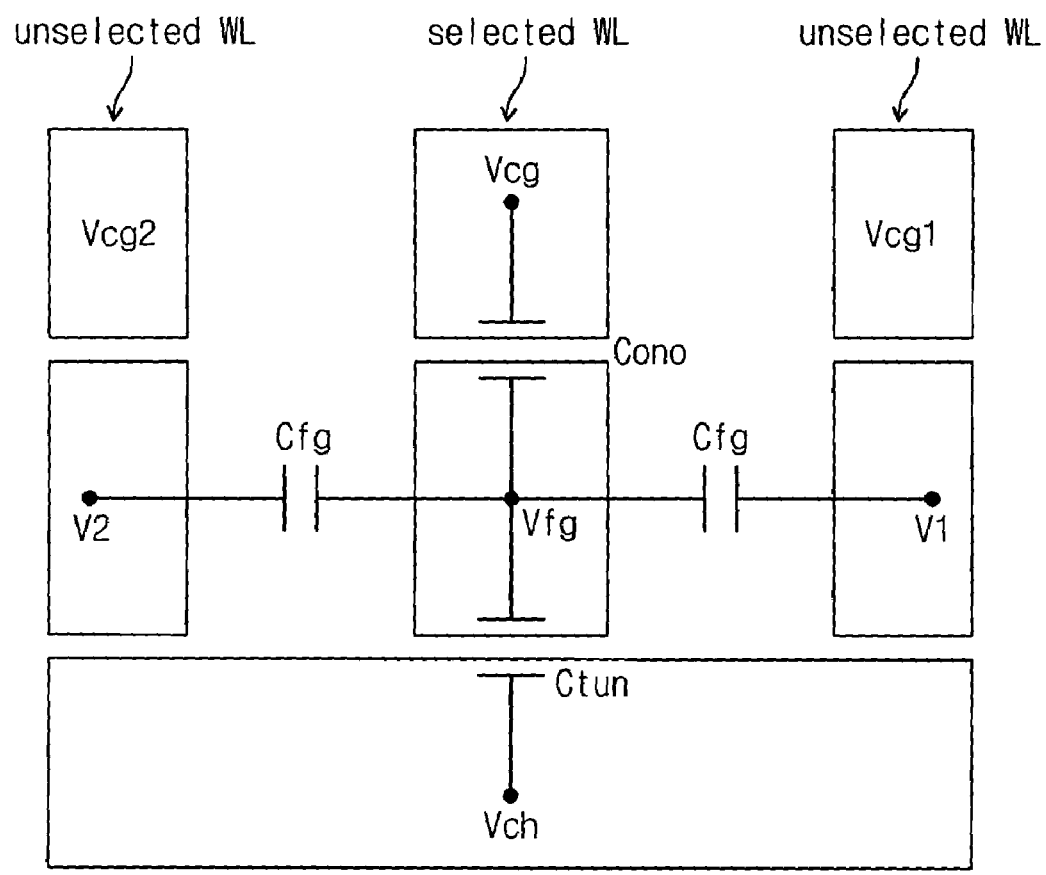
FIG. 3 illustrates a floating gate interference model between a selected memory cell transistor and adjacent memory cell transistors thereof, based on capacitive coupling.

In the case of a local self-boosting method as described with respect to FIG. 2, a floating gate voltage of a memory cell to be programmed can be 0V before a program voltage $V_{pgm}$ is applied. With local self-boosting methods according to embodiments of the present invention, a predetermined voltage can be induced on a floating gate of the memory cell transistor to be programmed before a program voltage $V_{pgm}$ is applied. Afterward, when the program voltage $V_{pgm}$ is applied to the selected word line WL13, a higher voltage than that of FIG. 2 can be induced on the floating gate of the memory cell transistor being programmed. Thus, an electric field across a tunnel oxide of the memory cell transistor to be programmed can be increased. At this time, a channel voltage of a cell transistor to be program-inhibited may be expressed as follows:

$$V_{ch} = \frac{V_{cc} - V_{th}}{N} + \frac{V_{pgm}}{3} \times \frac{C_i}{C_i + C_{ch}} + \frac{2V_{cp}}{3} \times \frac{C_i}{C_i + C_{ch}}.$$

Figure 7:
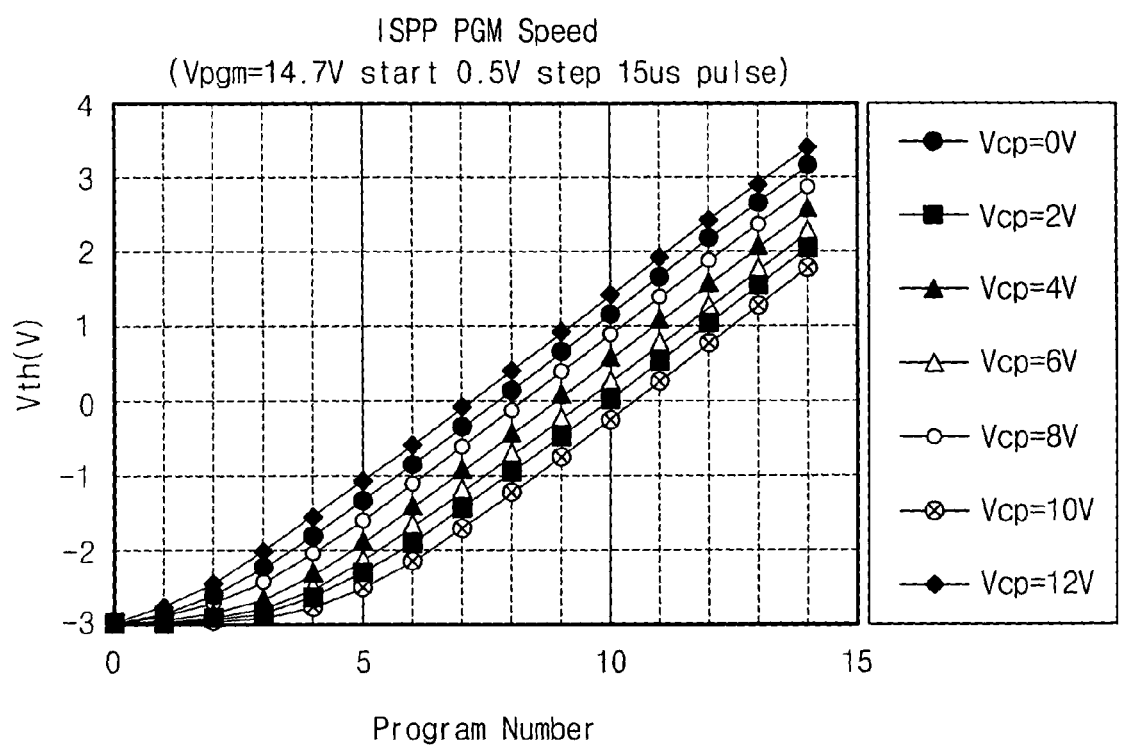
FIG. 7 illustrates voltage variations of floating gates of adjacent memory cell transistors at a program operation according to embodiments of the present invention.

As understood from the above equations, a floating gate voltage of a cell transistor to be programmed can be determined by a coupling voltage $V_{cp}$, as shown in FIG. 7. A graph in FIG. 7 can be obtained using the aforementioned ISSP scheme under the conditions that a spacer of a cell transistor is formed of an SiN material, that its gate-to-gate space and gate length are 0.12 $\mu$m, and that a polysilicon height is 1200 Å. In FIG. 7, an X-axis indicates a program number and a Y-axis indicates a threshold voltage of a cell transistor to be programmed.

As shown in FIG. 7, as a coupling voltage $V_{cp}$ increases, a program number may be reduced. For example, a memory cell may be assumed to be programmed to have a threshold voltage of 2V. When the coupling voltage $V_{cp}$ is 10V, program cycles or loops may be carried out 11 times, and when the coupling voltage $V_{cp}$ is 0V, program cycles or loops may be carried out 14 times. Thus program methods, according to embodiments of the present invention, may enable a program cycle to be shortened by three cycles. A program speed of a flash memory may be improved using local self-boosting schemes according to embodiments of the present invention. In particular, with local self-boosting schemes according to some embodiments of the present invention, the narrower a gate interval, the faster the program speed. This result may be provided because a capacitive coupling effect may be strengthened.

Figure 1:
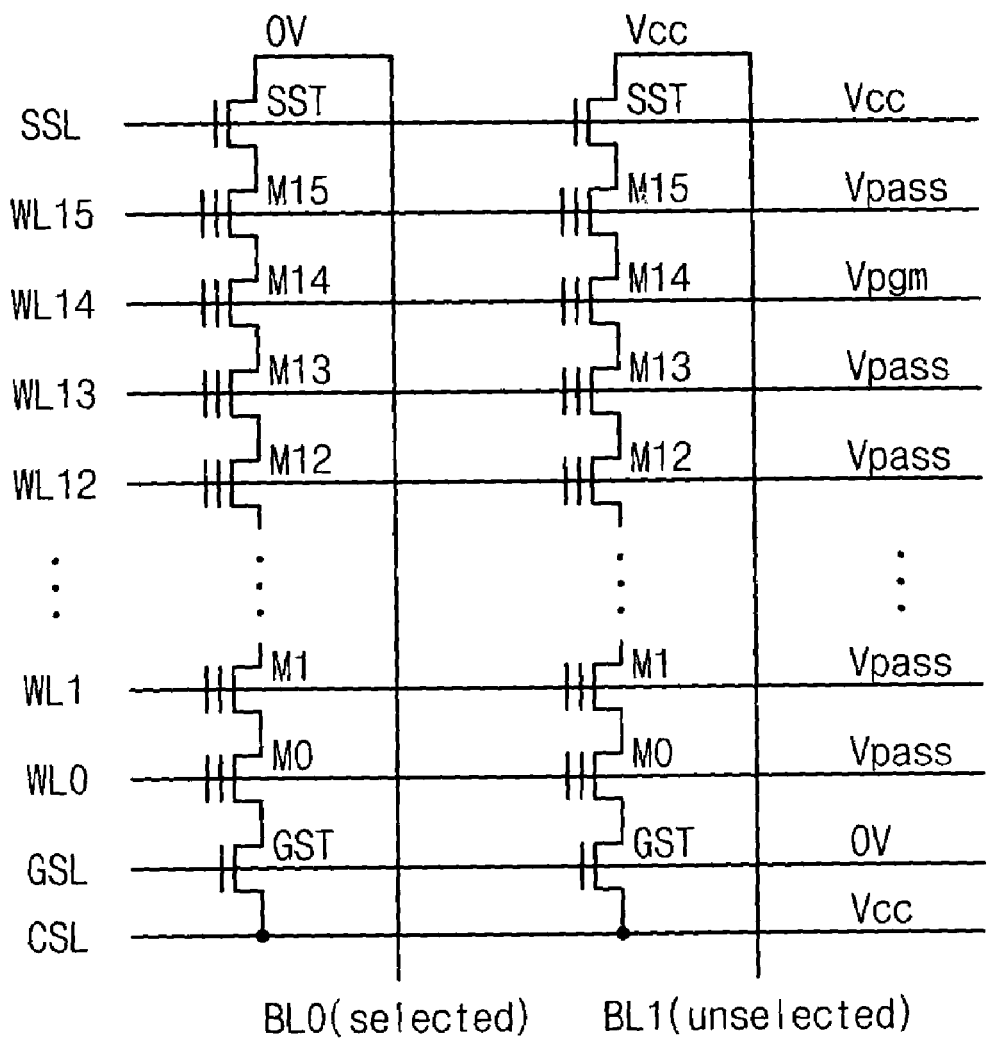
FIG. 1 is a diagram illustrating a program method using a self-boosting scheme according to the prior art.
Figure 8:
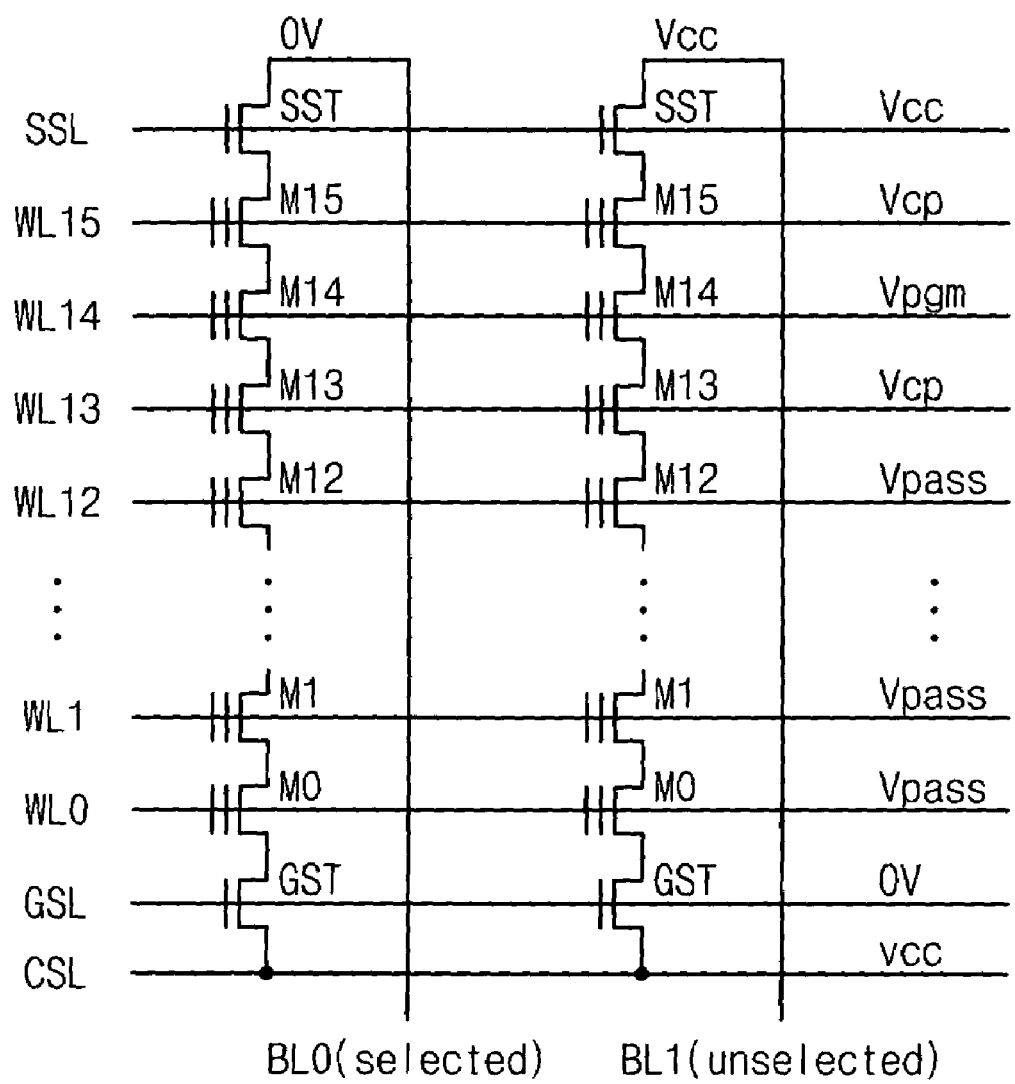
FIG. 8 illustrates word line voltage conditions of program operations according to embodiments of the present invention.
Figure 9:
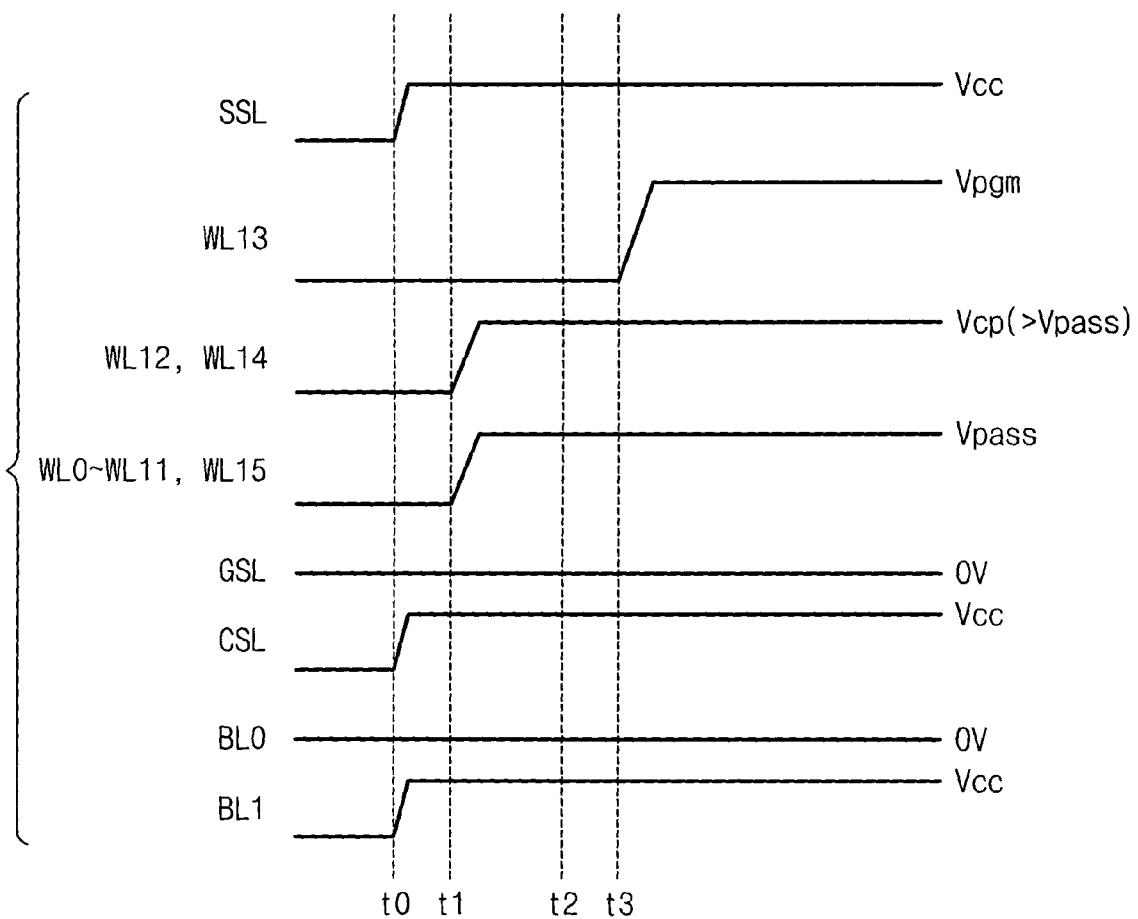
FIG. 9 is a timing diagram illustrating program methods according to embodiments of the present invention.

FIG. 8 is a diagram illustrating word line voltage conditions according to program methods according to embodiments of the present invention. FIG. 9 is a timing diagram illustrating program methods according to embodiments of the present invention. As shown in FIGS. 8 and 9, a coupling voltage $V_{cp}$ can be applied to unselected word lines WL12 and WL14 closely adjacent to a selected word line WL13, and a pass voltage $V_{pass}$ can be applied to remaining word lines WL0–WL11. Aspects of a program method in FIG. 8 can be similar to aspects of a self-boosting scheme in FIG. 1 with different bias conditions, and description of similarities is thus omitted. A coupling effect of a floating gate of a cell transistor to be programmed can be improved by establishing a relatively high coupling voltage $V_{cp}$. Improvement of coupling effects may provide improvement of program speeds.

Self-boosting methods according to embodiments of the present invention can be applied to program both single-level cells and/or a multi-level cells. In particular, in the case of a multi-level cell which may need a higher program voltage than a single-level cell, it may be possible to program memory cells faster using local self-boosting methods according to embodiments of the present invention. Therefore, local self-boosting methods according to embodiments of the present invention may make it easier to realize a relatively high-speed multi-level memory device without a burdensome increase in a peripheral circuit area. In the case of a multi-level memory device, when data of 11, 01, 10 and 00 is programmed, a program voltage may be established differently at program steps of 01, 10 and 00, while a coupling voltage $V_{cp}$ is maintained at each program step. Programming of multi-level cells is discussed for example, in U.S. Pat. No. 5,768,188 entitled "MULTI-STATE NON-VOLATILE SEMICONDUCTOR MEMORY AND METHOD FOR DRIVING THE SAME", the disclosure of which herein incorporated by reference. A farther discussion of multi-level programming using local self-boosting schemes according to embodiments of the present invention is thus omitted.

As set forth above, a voltage induced to a floating gate of a cell transistor to be programmed can be increased by applying a coupling voltage to unselected cell transistors adjacent to the cell transistor to be programmed and by applying a decoupling voltage to cell transistors adjacent to unselected memory cell transistors. A time to program memory cells can thus be shortened. A program speed of a non-volatile memory device according to embodiments of the present invention can thus be improved.

Non-volatile semiconductor memories according to embodiments of the present invention may provide improved program speeds. A NAND-type flash memory according to embodiments of the present invention may provide an improved local self-boosting scheme where before a program voltage is applied to a selected word line, a coupling voltage (being higher or lower than a pass voltage) is applied to an unselected word line(s) closely adjacent to a selected word line, and a decoupling voltage (e.g., 0V) is applied to an unselected word line(s) adjacent to the unselected word line(s) which is closely adjacent to the selected word line. A floating gate voltage of a memory cell transistor connected to the selected word line may be affected by a floating gate voltage of a memory cell transistor(s) supplied with the coupling voltage. Accordingly, an electric field across a tunnel oxide of a memory cell transistor connected to a selected word line can be increased as compared with a conventional local self-boosting method. As a result, a program operation may be performed more rapidly than a conventional local self-boosting method while maintaining an increased channel voltage of a program-inhibit cell transistor. A program speed may be improved by using local self-boosting methods according to embodiments of the present invention.

While this invention has been particularly shown and described with reference to preferred embodiments thereof, it will be understood by those skilled in the art that various changes in form and details may be made therein without departing from the spirit and scope of the invention as defined by the appended claims and their equivalents.

What is claimed is:

1. A method of programming a non-volatile memory device including a string of serially connected memory cell transistors with each memory cell transistor of the string being connected to a different word line, the method comprising:
   applying a pass voltage to a first word line connected to a first memory cell transistor of the string;
   applying a coupling voltage to a second word line connected to a second memory cell transistor of the string and wherein the pass voltage and the coupling voltage are different;
   applying a decoupling voltage to a third word line connected to a third memory cell transistor of the string wherein the third memory cell transistor of the string is serially connected between the first and second memory cell transistors, wherein the coupling voltage is greater than the decoupling voltage; and
   while applying the pass voltage to the first word line, while applying the coupling voltage to the second word line, and while applying the decoupling voltage to the third word line, applying a program voltage to a fourth word line connected to a fourth memory cell transistor of the string, the fourth memory cell transistor being programmed responsive to applying the program voltage to the fourth word line wherein the second memory cell transistor is between the first and fourth memory cell transistors of the serially connected string.

2. A method according to claim 1 further comprising:
   applying the pass voltage to a fifth word line connected to a fifth memory cell transistor of the string wherein the first memory cell transistor is serially connected between the fifth memory cell transistor and the second memory cell transistor.

3. A method according to claim 1 wherein the coupling voltage is greater than the pass voltage.

4. A method according to claim 1 wherein each memory cell transistor of the string stores one bit of data.

5. A method according to claim 1 wherein each memory cell of the transistor of the string stores a plurality of bits of data.

6. A method according to claim 1 further comprising:
   wherein the decoupling voltage is less than the pass voltage, and less than the program voltage.

7. A method according to claim 6 wherein the decoupling voltage comprises a ground voltage of the memory device.

8. A method according to claim 6 wherein the decoupling voltage is less than a ground voltage of the memory device.

9. A method according to claim 6 further comprising:
   before applying the decoupling voltage to the third word line, applying a preliminary voltage to the third word line wherein the preliminary voltage is greater than the decoupling voltage and wherein the decoupling voltage is applied to the third word line before applying the program voltage to the fourth word line.

10. A method according to claim 9 wherein the preliminary voltage is equal to the pass voltage.

11. A method according to claim 1 wherein the non-volatile memory device includes a second string of serially connected memory cell transistors with a memory cell transistor of the second string being connected to the fourth word line, the method further comprising:
    before applying the program voltage, precharging a channel of the fourth memory cell transistor with a first precharge voltage; and
    before applying the program voltage, precharging a channel of the memory cell transistor of the second string connected to the fourth word line with a second voltage different than the first voltage.

12. A method according to claim 11 wherein the first voltage is a ground voltage of the memory device and wherein the second voltage is a difference between a power supply voltage of the memory device and a threshold voltage of the select transistor of the second string.

13. A method according to claim 1 wherein the coupling voltage is greater than a ground voltage of the memory device.

14. A method of programming a non-volatile memory device including string of serially connected memory cell transistors with each memory cell transistor of the string being connected to a different word line, the method comprising:
    applying a decoupling voltage to a first word line connected to a first memory cell transistor of the string;
    applying a coupling voltage to a second word line connected to a second memory cell transistor of the string wherein the coupling voltage is greater than the decoupling voltage; and
    while applying the decoupling voltage to the first word line and while applying the coupling voltage to the second word line, applying a program voltage to a word line connected to a memory cell transistor of the string, the memory cell transistor being programmed responsive to applying the program voltage to the word line wherein the second memory cell transistor is between the first and memory cell transistors of the serially connected string.

15. A method according to claim 14 further comprising:
    before applying the decoupling voltage to the first word line, applying a preliminary voltage to the first word line wherein the preliminary voltage is greater that the decoupling voltage and wherein the decoupling voltage is applied to the first word line before applying the program voltage to the word line.

16. A method according to claim 15 further comprising:
    applying a pass voltage to a fourth word line connected to a fourth memory cell transistor of the string wherein the first memory cell transistor is serially connected between the fourth and second memory cell transistors; wherein the pass voltage is greater than the decoupling voltage, and wherein the pass voltage is equal to the preliminary voltage.

17. A method according to claim 14 further comprising:
    applying a pass voltage to a fourth word line connected to a fourth memory cell transistor of the string wherein the first memory cell transistor is serially connected between the fourth and second memory cell transistors, wherein the pass voltage is greater than the decoupling voltage.

18. A method according to claim 17 further comprising:
    applying the pass voltage to a fifth word line connected to a fifth memory cell transistor of the string wherein the fourth memory cell transistor is serially connected between the fifth and first memory cell transistors.

19. A method according to claim 17 wherein the coupling voltage is greater than or equal to the pass voltage.

20. A method according to claim 17 wherein the coupling voltage is greater than the pass voltage.

21. A method according to claim 14 wherein each memory cell of the string stores one bit of data.

22. A method according to claim 14 wherein each memory cell of the string stores a plurality of bits of data.

23. A method according to claim 14 wherein the decoupling voltage comprises a ground voltage of the memory device.

24. A method according to claim 14 wherein the decoupling voltage is less than a ground voltage of the memory device.

25. A method according to claim 14 wherein the non-volatile memory device includes a second string of serially connected memory cell transistors with a memory cell transistor of the second string being connected to the word line, the method further comprising:
    before applying the program voltage, precharging a channel of the memory cell transistor with a first precharge voltage; and
    before applying the program voltage, precharging a channel of the memory cell transistor of the second string connected to the word line with a second voltage different than the first voltage.

26. A method according to claim 25 wherein the first voltage is a ground voltage of the memory device and wherein the second voltage is a difference between a power supply voltage of the memory device and a threshold voltage of the select transistor of the second string.

27. A non-volatile memory device comprising:
    a string of serially connected memory cell transistors
    a plurality of word lines with each word line being connected to a different one of the serially connected memory cell transistors; and
    a row selection circuit connected to the plurality of word lines, the row selection circuit being configured to apply a pass voltage to a first word line connected to a first memory cell transistor of the string, the row selection circuit being configured to apply a coupling voltage to a second word line connected to a second memory cell transistor of the string wherein the pass voltage and the coupling voltage are different, the row selection circuit being configured to apply a decoupling voltage to a third word line connected to a third memory cell transistor of the string wherein the third memory cell transistor is serially connected between the first and second memory cell transistors and wherein the coupling voltage is greater than the decoupling voltage, and the row selection circuit being configured to apply a program voltage to a fourth word line connected to a fourth memory cell transistor of the string while applying the pass voltage to the first word line, while applying the coupling voltage to the second word line, and while applying the decoupling voltage to the third word line, the fourth memory cell transistor being programmed responsive to applying the program voltage to the fourth word line wherein the second memory cell transistor is between the first and fourth memory cell transistors of the serially connected string.

28. A non-volatile memory device according to claim 27 wherein the coupling voltage is greater than the pass voltage.

29. A non-volatile memory device according to claim 27 wherein each memory cell transistor of the string stores one bit of data.

30. A non-volatile memory device according to claim 27 wherein each memory cell of the transistor of the string stores a plurality of bits of data.

31. A non-volatile memory device according to claim 27 wherein the decoupling voltage is less than the pass voltage and less than the program voltage.

32. A non-volatile memory device according to claim 31 wherein the decoupling voltage comprises a ground voltage of the memory device.

33. A non-volatile memory device according to claim 31 wherein the decoupling voltage is less than a ground voltage of the memory device.

34. A non-volatile memory device according to claim 31 wherein the row selection circuit is further configured to apply a preliminary voltage to the third word line before applying the decoupling voltage to the third word line, wherein the preliminary voltage is greater than the decoupling voltage and wherein the decoupling voltage is applied to the third word line before applying the program voltage to the fourth word line.

35. A non-volatile memory device according to claim 34 wherein the preliminary voltage is equal to the pass voltage.

36. A non-volatile memory device according to claim 27 further comprising:
    a second string of serially connected memory cell transistors with a memory cell transistor of the second string being connected to the fourth word line; and
    a precharge circuit coupled to the first and second strings of serially connected memory cell transistors wherein the precharge circuit is configured to precharge a channel of the fourth memory cell transistor with a first precharge voltage before applying the program voltage, and wherein the precharge circuit is configured to precharge a channel of the memory cell transistor of the second string connected to the fourth word line with a second voltage different than the first voltage before applying the program voltage.

37. A non-volatile memory device according to claim 36 wherein the first voltage is a ground voltage of the memory device and wherein the second voltage is a difference between a power supply voltage of the memory device and a threshold voltage of a select transistor of the second string.

38. A non-volatile memory device according to claim 27 wherein the row selection circuit is further configured to apply the pass voltage to a fifth word line connected to a fifth memory cell transister of the string wherein the first memory cell transistor is serially connected between the fifth memory cell transister and the second memory cell transistor.

39. A non-volatile memory device according to claim 27 wherein the coupling voltage is greater than a ground voltage of the memory device.

40. A non-volatile memory device comprising:
    a string of serially connected memory cell transistors;
    a plurality of word lines with each word line being connected to a different one of the serially connected memory cell transistors; and
    a row selection circuit connected to the plurality of word lines, the row selection circuit being configured to apply a decoupling voltage to a first word line connected to a first memory cell transistor of the string, the row selection circuit being configured to apply a coupling voltage to a second word line connected to a second memory cell transistor of the string wherein the coupling voltage is greater than the decoupling voltage, and the row selection circuit being configured to apply a program voltage to a word line connected to a memory cell transistor of the string while applying the decoupling voltage to the first word line and while applying the coupling voltage to the second word line, the memory cell transistor being programmed responsive to applying the program voltage to the word line wherein the second memory cell transistor is between the first and memory cell transistors of the serially connected string.

41. A non-volatile memory device according to claim 40 wherein the row selection circuit is further configured to apply a pass voltage to a fourth word line connected to a fourth memory cell transistor of the string wherein the first memory cell transistor is serially connected between the fourth and second memory cell transistors, wherein the pass voltage is greater than the decoupling voltage.

42. A non-volatile memory device according to claim 41 wherein the row selection circuit is further configured to apply the pass voltage to a fifth word line connected to a fifth memory cell transistor of the string wherein the fourth memory cell transistor is serially connected between the fifth and first memory cell transistors.

43. A non-volatile memory device according to claim 41 wherein the coupling voltage is greater than or equal to the pass voltage.

44. A non-volatile memory device according to claim 41 wherein the coupling voltage is greater than the pass voltage.

45. A non-volatile memory device according to claim 40 wherein each memory cell of the string stores one bit of data.

46. A non-volatile memory device according to claim 40 wherein each memory cell of the string stores a plurality of bits of data.

47. A non-volatile memory device according to claim 40 wherein the decoupling voltage comprises a ground voltage of the memory device.

48. A non-volatile memory device according to claim 40 wherein the decoupling voltage is less than a ground voltage of the memory device.

49. A non-volatile memory device according to claim 40 further comprising:
   a second string of serially connected memory cell transistors with a memory cell transistor of the second string being connected to the word line;
   a precharge circuit connected to the first and second strings of serially connected memory cells, the precharge circuit being configured to precharge a channel of the memory cell transistor with a first precharge voltage before applying the program voltage, and the precharge circuit being configured to precharge a channel of the memory cell transistor of the second string connected to the word line with a second voltage different than the first voltage before applying the program voltage.

50. A non-volatile memory device according to claim 49 wherein the first voltage is a ground voltage of the memory device and wherein the second voltage is a difference between a power supply voltage of the memory device and a threshold voltage of a select transistor of the second string.

51. A non-volatile memory device according to claim 40 wherein the row selection circuit is further configured to apply a preliminary voltage to the first word line before applying the decoupling voltage to the first word line, wherein the preliminary voltage is greater that the decoupling voltage and wherein the decoupling voltage is applied to the first word line before applying the program voltage to the word line.

52. A non-volatile memory device according to claim 51 wherein the row selection circuit is further configured to apply a pass voltage to a fourth word line connected to a fourth memory cell transistor of the string wherein the first memory cell transistor is serially connected between the fourth and second memory cell transistors, wherein the pass voltage is greater than the decoupling voltage, and wherein the pass voltage is equal to the preliminary voltage.

53. A program method of a non-volatile semiconductor memory device which includes strings each connected to corresponding bit lines and each having a plurality of memory cell transistors, the memory cell transistors being connected in series between first and second select transistors and to corresponding word lines, the program method comprising the steps of:
   supplying a coupling voltage to at least one first word line and a decoupling voltage to a second word line; and
   supplying a program voltage to a word line connected to a memory cell transistor to be programmed, wherein the first word line is closely adjacent to the word line and the second word line is closely adjacent word line to the first word line; and wherein the coupling voltage is higher than the decoupling voltage.

54. The program method according to claim 53, wherein a pass voltage is supplied to remaining word lines.

55. The program method according to claim 54, wherein the coupling voltage is equal to or higher than the pass voltage.

56. The program method according to claim 55, further comprising the step of precharging a channel of the memory cell transistor to be programmed with a first voltage and a channel of a memory cell transistor to be program-inhibited with a second voltage.

57. The program method according to claim 56, wherein the first voltage is a ground voltage and the second voltage is (Vcc−Vth), the Vth being a threshold voltage of the first select transistor and the Vcc being a power supply voltage.

58. The program method according to claim 53, wherein each of the memory cell transistors stores multi-bit data.

59. The program method according to claim 53, wherein each of the memory cell transistors stores multi-bit data.

60. The program method according to claim 53, wherein the decoupling voltage is a ground voltage.

61. The program method according to claim 53, wherein the decoupling voltage is lower than a ground voltage.

62. A program method of a non-volatile semiconductor memory device which includes strings each connected to corresponding bit lines and each having a plurality of memory cell transistors, the memory cell transistors being connected in series between first and second select transistors and to corresponding word lines, the program method comprising the steps of:
   charging a channel of a memory cell transistor to be programmed with a first voltage and a channel of a memory cell transistor to be program-inhibited with a second voltage, respectively;
   supplying a coupling voltage to first two word lines, a decoupling voltage to second two word lines, and a pass voltage to remaining word lines, the first word lines being closely adjacent to a word line connected to the memory cell transistor to be programmed and the second word lines being closely adjacent to the first word line, respectively; and
   supplying a program voltage to the word line, wherein the decoupling voltage is lower than the coupling and pass voltages; and wherein the coupling voltage is equal to or
   lower than the pass voltage.

63. The program method according to claim 62, wherein each of the memory cell transistors stores multi-bit data.

64. The program method according to claim 62, wherein the decoupling voltage is a ground voltage.

65. The program method according to claim 62, wherein the decoupling voltage is lower than a ground voltage.

66. The program method according to claim 62, wherein the first voltage is a ground voltage and the second voltage is (Vcc−Vth), the Vth being a threshold voltage of the first select transistor and the Vcc being a power supply voltage.

67. The program method according to claim 62, wherein each of the memory cell transistors stores 1-bit data.

68. A program method of a non-volatile semiconductor memory device which includes strings each connected to corresponding bit lines and each having a plurality of memory cell transistors, the memory cell transistors being connected in series between first and second select transistors and to corresponding word lines, the program method comprising the steps of:
charging a channel of a memory cell transistor to be programmed with a first voltage and a channel of a memory cell transistor to be program-inhibited with a second voltage, respectively;
supplying a coupling voltage to a first word line and a pass voltage to remaining word lines, the first word line being closely adjacent to a word line connected to the memory cell transistor to be programmed; and
supplying a program voltage to the word line, wherein the coupling voltage is equal to or higher than the pass voltage.

69. The program method according to claim 68, wherein each of the memory cell transistors stores multi-bit data.

70. The program method according to claim 68, wherein the first voltage is a ground voltage and the second voltage is (Vcc–Vth), the Vth being a threshold voltage of the first select transistor and the Vcc being a power supply voltage.

71. The program method according to claim 68, wherein each of the memory cell transistors stores 1-bit data.

72. A non-volatile semiconductor memory device comprising:
a plurality of bit lines;
a plurality of word lines;
a plurality of cell strings connected to the bit lines, respectively, each of the cell strings being connected between a corresponding bit line and a common source line and having a first select transistor connected to a string select line, a second select transistor connected to a ground select line, and a plurality of memory cell transistors connected in series between the first and second transistors and to corresponding word lines respectively;
a row selector circuit connected to the string select line, the word lines and the ground select line, for selecting a first one of the word lines; and
a precharge circuit for supplying a first voltage to channels of memory cell transistors to be programmed and a second voltage to channels of memory cell transistors to be program-inhibited among memory cell transistors at a program operation, the transistors to be programmed and program-inhibited being connected to the first word line,
wherein before a program voltage is supplied to the first word line, the row selector circuit supplies a coupling voltage to a second word line closely adjacent to the first word line, a decoupling voltage to a word line closely adjacent to the second word line, and a pass voltage to remaining word lines, the coupling voltage being higher than the decoupling voltage.

73. The memory device according to claim 72, wherein each of the memory cell transistors stores multi-bit data.

74. The memory device according to claim 72, wherein the decoupling voltage is a ground voltage.

75. The memory device according to claim 72, wherein the decoupling voltage is lower than a ground voltage.

76. The memory device according to claim 72, wherein the coupling voltage is equal to or higher than the pass voltage.

77. The memory device according to claim 72, wherein the coupling voltage is lower than the pass voltage.

78. The memory device according to claim 72, wherein the first voltage is a ground voltage and the second voltage is (Vcc–Vth), the Vth being a threshold voltage of the first select transistor and the Vcc being a power supply voltage.

79. The memory device according to claim 72, wherein each of the memory cell transistors stores 1-bit data.

80. A non-volatile semiconductor memory device comprising:
a plurality of bit lines;
a plurality of word lines;
a plurality of cell strings connected to the bit lines, respectively, each of the cell strings being connected between a corresponding bit line and a common source line and having a first select transistor connected to a string select line, a second select transistor connected to a ground select line, and a plurality of memory cell transistors connected in series between the first and second transistors and to corresponding word lines respectively;
a row selector circuit connected to the string select line, the word lines and the ground select line, for selecting a first one of the word lines; and
a precharge circuit for supplying a first voltage to channels of memory cell transistors to be programmed and a second voltage to channels of memory cell transistors to be program-inhibited among memory cell transistors at a program operation, the transistors to be programmed and program-inhibited being connected to the first word line,
wherein before a program voltage is supplied to the first word line, the row selector circuit supplies a coupling voltage to a second word line closely adjacent to the first word line and a pass voltage to remaining word lines, the coupling voltage being equal to or higher than the pass voltage.

81. The memory device according to claim 80, wherein the first voltage is a ground voltage and the second voltage is (Vcc–Vth), the Vth being a threshold voltage of the first select transistor and the Vcc being a power supply voltage.

82. The memory device according to claim 80, wherein each of the memory cell transistors stores 1-bit data.

* * * * *

UNITED STATES PATENT AND TRADEMARK OFFICE
CERTIFICATE OF CORRECTION

PATENT NO. : 6,987,694 B2
APPLICATION NO. : 10/640082
DATED : January 17, 2006
INVENTOR(S) : Lee It is certified that error appears in the above-identified patent and that said Letters Patent is hereby corrected as shown below:

Column 14,
Line 24-25 should read -- second word line, applying a program voltage to a third word line connected to a third memory cell transistor of the string, Line 27 should read -- sive to applying the program voltage to the third word line --

Line 29 should read -- the first and third memory cell transistors of the serially --

Column 15,
Line 13 should read -- nel of the third memory cell transistor with a first precharge --

Line 17 should read -- connected to the third word line with a second voltage --

Column 16,
Lines 57-58 should read -- a program voltage to a third word line connected to a third memory cell transistor of the string while applying the --

Lines 61-62 should read -- the third memory cell transistor being programmed responsive to applying the program voltage to the third word line --

Line 64 should read -- the first and third memory cell transistors of the serially --

Column 17,
Line 36 should read -- of the third memory cell transistor with a first precharge --

Line 40 should read -- connected to the third word line with a second voltage --

Column 18,
Line 6 should read -- supplying a program voltage to a third word line connected to --

Line 8 should read -- the first word line is closely adjacent to the third word line --

Line 27 should read -- each of the memory cell transistors stores 1-bit data. --

Line 48 should read -- lines being closely adjacent to a third word line connected to --

UNITED STATES PATENT AND TRADEMARK OFFICE
CERTIFICATE OF CORRECTION

PATENT NO. : 6,987,694 B2
APPLICATION NO. : 10/640082
DATED : January 17, 2006
INVENTOR(S) : Lee It is certified that error appears in the above-identified patent and that said Letters Patent is hereby corrected as shown below:

Column 19,
Line 16 should read -- being closely adjacent to a third word line connected to the --

Line 18 should read -- supplying a program voltage to the third word line , wherein the --

Line 55 should read -- first word line, a decoupling voltage to a third word line --

Column 20,
Line 14 should read -- 78. The memory device according to claim 80, wherein --

Signed and Sealed this

Fifteenth Day of August, 2006

JON W. DUDAS
*Director of the United States Patent and Trademark Office*